(12) United States Patent
Tsukurimichi

(10) Patent No.: US 8,546,959 B2
(45) Date of Patent: Oct. 1, 2013

(54) RESIN COMPOSITION FOR ENCAPSULATING SEMICONDUCTOR, METHOD FOR PRODUCING SEMICONDUCTOR DEVICE AND SEMICONDUCTOR DEVICE

(75) Inventor: Keiichi Tsukurimichi, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 13/133,752

(22) PCT Filed: Dec. 2, 2009

(86) PCT No.: PCT/JP2009/006562
§ 371 (c)(1),
(2), (4) Date: Jun. 9, 2011

(87) PCT Pub. No.: WO2010/067546
PCT Pub. Date: Jun. 17, 2010

(65) Prior Publication Data
US 2011/0260342 A1   Oct. 27, 2011

(30) Foreign Application Priority Data
Dec. 10, 2008   (JP) .................................. 2008-314066

(51) Int. Cl.
*H01L 23/29*   (2006.01)
*H01L 21/00*   (2006.01)
*B32B 5/16*   (2006.01)

(52) U.S. Cl.
USPC ................. 257/788; 257/793; 257/E23.116; 257/E21.502; 257/E21.504; 438/124; 438/127; 428/402

(58) Field of Classification Search
USPC .................. 257/788, 791–793, E21.504, 787, 257/E23.116, E23.119, 795, E21.502; 438/124, 438/127; 428/402; 427/127
See application file for complete search history.

(56) References Cited

U.S. PATENT DOCUMENTS 6,120,716 A   9/2000  Kushida et al.
7,348,220 B2 *   3/2008  Ito et al. ......................... 438/127
(Continued)

FOREIGN PATENT DOCUMENTS

JP   11-246671 A   9/1999
JP   2000-21908 A   1/2000
(Continued)

OTHER PUBLICATIONS

International Search Report, dated Feb. 9, 2010, issued in PCT/JP2009/006562.
(Continued)

*Primary Examiner* — Jasmine Clark
(74) *Attorney, Agent, or Firm* — Birch Stewart Kolasch & Birch, LLP

(57) ABSTRACT

Disclosed is a granular resin composition for encapsulating a semiconductor used for a semiconductor device obtained by encapsulating a semiconductor element by compression molding, satisfying the following requirements (a) to (c) on condition that ion viscosity is measured with a dielectric analyzer under a measurement temperature of 175° C. and a measurement frequency of 100 10 Hz: (a) the time from the initiation of the measurement until a decrease of the ion viscosity to the lowest ion viscosity is 20 seconds or shorter; (b) the lowest ion viscosity value is not more than 6.5; and (c) the time interval between the time from the initiation of the measurement until a decrease of the ion viscosity to the lowest ion viscosity and the time from the initiation of the measurement until the ion viscosity reaching 90% of an ion viscosity value measured at 300 seconds is 10 seconds or longer.

11 Claims, 6 Drawing Sheets

(56) References Cited

U.S. PATENT DOCUMENTS

| | | | |
|---|---|---|---|
| 2008/0029933 A1* | 2/2008 | Higashiizumi et al. | 264/328.1 |
| 2008/0246008 A1 | 10/2008 | Kuroda | |
| 2010/0193972 A1* | 8/2010 | Yamamoto et al. | 257/789 |

FOREIGN PATENT DOCUMENTS

| | | |
|---|---|---|
| JP | 3135926 B2 | 2/2001 |
| JP | 2003-285319 A | 10/2003 |
| JP | 2006-70197 A | 3/2006 |
| JP | 2006-216899 A | 8/2006 |
| JP | 2008-121003 A | 5/2008 |
| JP | 2008-266610 A | 11/2008 |
| JP | 2008-266611 A | 11/2008 |

OTHER PUBLICATIONS

Office Action for corresponding Japanese Patent Application No. 2009-275923, dated Mar. 19, 2013.

* cited by examiner

US 8,546,959 B2

RESIN COMPOSITION FOR ENCAPSULATING SEMICONDUCTOR, METHOD FOR PRODUCING SEMICONDUCTOR DEVICE AND SEMICONDUCTOR DEVICE

TECHNICAL FIELD

The present invention relates to a granular resin composition for encapsulating a semiconductor which is suitable for encapsulating a semiconductor element by compression molding, a method for producing a semiconductor device using the granular resin composition and a semiconductor device obtained by the method.

BACKGROUND ART

In encapsulation of a semiconductor device (hereinafter also referred to as the package) by transfer molding, a problem of wire sweep has heretofore been pointed out, and in compliance with changes in package shapes, measures for optimization of molding conditions, a reduction of viscosity in a resin composition for encapsulating a semiconductor (hereinafter also referred to as the resin composition) and the like have been taken. However, in recent trend, on the one hand, for a semiconductor device, fine pitch wire bonding and finer wiring of wires have been advanced by finer wiring in a semiconductor element (hereinafter also referred to as the element or the chip) for the purposes of higher functionality and cost reduction, and accordingly more wire sweep has easily occurred than ever before. On the other hand, with the progress of improvement of the reliability in a semiconductor device and high filling of a filler for the purpose of a reduction of warpage in BGA (Ball Grid Array), further viscosity reduction of a resin composition becomes difficult, and measures with respect to wire sweep have been more difficult than ever before. In addition, moldability failure in welding or the like has easily occurred due to narrow gap formation right above the chip caused by thinning of packages and elements made into multiple stages, and molded MAP (mold array package) formation.

In the compression molding technique, the flow rate of a resin is remarkably lower and flow in the lateral direction is smaller, as compared to transfer molding which has been widely used for encapsulation of a semiconductor, so that wire sweep hardly occurs and the compression molding technique is a powerful measure for the above fine pitching. Furthermore, the compression molding technique is an excellent molding method with respect to filling of a narrow gap portion right above the chip in which welding according to the molding method hardly takes place, is a molding method suitable for fine pitching and thinning of a semiconductor device to be developed hereafter, and is expected to be widely applied hereafter.

As a method for obtaining a semiconductor device obtained by encapsulating a semiconductor element by compression molding using a resin composition for encapsulating a semiconductor, there have been proposed a method including using a granular resin composition (for example, refer to Patent Document 1), and a method including using a sheet-like resin composition (for example, refer to Patent Documents 2 and 3).

In case of the method including using a granular resin composition, there was a need to carry out conveyance and weighing of the resin composition before the granular resin composition was put into a cavity of a compression mold installed in a compression molding machine. However, according to the method described in Patent Document 1, relatively large granules having a size of about 2 mm were used, so that weighing accuracy was not sufficient in some cases.

Meanwhile, the granular resin composition put into the cavity of the compression mold installed in the compression molding machine was melted in the cavity by closing the mold using the compression molding machine, and was filled in the whole cavity. However, at this time, the degree of wire sweep and filling properties of the narrow gap portion right above the chip were depending on the melt viscosity of the melted resin composition and the way of progress of curing thereof.

In Patent Document 3, for the purpose of reduction in wire sweep, there has been proposed that the melt viscosity and the gel time of the resin were in the specific range, but this method related to a method including using the resin processed into a sheet form, and the melt viscosity of the melted resin composition and the way of progress of curing have not been proposed in compression molding using the granular resin composition.

RELATED DOCUMENTS

Patent Documents

Patent Document 1: Japanese Patent Application Laid-Open No. 2000-021908
Patent Document 2: Japanese Patent Application Laid-Open No. 2006-216899
Patent Document 3: Japanese Patent Application Laid-Open No. 2006-070197

DISCLOSURE OF THE INVENTION

The present invention is to provide a resin composition for encapsulating a semiconductor in which excellent filling properties are achieved, a short circuit failure in wires hardly occurs, and the yield rate during compression molding and the quality of a semiconductor device are enhanced, in case that a semiconductor device is obtained by encapsulating a semiconductor element by compression molding using the granular resin composition for encapsulating a semiconductor, and a method for producing a semiconductor device using the resin composition.

The resin composition for encapsulating a semiconductor of the present invention is a granular resin composition for encapsulating a semiconductor used for a semiconductor device obtained by encapsulating a semiconductor element by compression molding, and is characterized in that it satisfies the following requirements (a) to (c) on condition that ion viscosity is measured with a dielectric analyzer under a measurement temperature of 175° C. and a measurement frequency of 100 Hz:

(a) the time from the initiation of the measurement until a decrease of the ion viscosity to the lowest ion viscosity is 20 seconds or shorter;
(b) the lowest ion viscosity value is not more than 6.5; and
(c) the time interval between the time from the initiation of the measurement until a decrease of the ion viscosity to the lowest ion viscosity and the time from the initiation of the measurement until the ion viscosity reaching 90% of an ion viscosity value measured at 300 seconds is 10 seconds or longer.

In the particle size distribution as determined by sieving the whole resin composition for encapsulating a semiconductor of the present invention using JIS standard sieves, microfine particles having a particle diameter of less than 106 μm may be contained at a ratio of not more than 5% by mass, based on the whole resin composition for encapsulating a semiconductor.

In the particle size distribution as determined by sieving the whole resin composition for encapsulating a semiconductor of the present invention using JIS standard sieves, coarse particles having a particle diameter of 2 mm or greater may be contained at a ratio of not more than 3% by mass, based on the whole resin composition for encapsulating a semiconductor.

The resin composition for encapsulating a semiconductor of the present invention may be obtained by supplying the melt-kneaded resin composition for encapsulating a semiconductor to the inside of a rotor composed of a cylindrical outer peripheral portion having a plurality of small pores and a disk-shaped bottom surface in which a temperature is adjusted by use of a direct or indirect heating means in a molten state, and allowing the resin composition for encapsulating a semiconductor to pass through the small pores by centrifugal force obtained by the rotation of the rotor.

The method for producing a semiconductor device of the present invention is characterized in that a semiconductor element is encapsulated by compression molding using the aforementioned granular resin composition for encapsulating a semiconductor.

The method for producing a semiconductor device of the present invention may include carrying out a step of conveying and weighing the granular resin composition for encapsulating a semiconductor immediately before the step of compression molding.

The method for producing a semiconductor device of the present invention may include carrying out the compression molding while degassing air in the cavity of the compression mold.

The semiconductor device of the present invention is a semiconductor device obtained by bonding and fixing a semiconductor element on a die pad of a lead frame or a substrate, connecting a wire bonding pad of the semiconductor element with an inner lead of the lead frame or a wire bonding pad on the substrate by means of wires, and then encapsulating the semiconductor element by compression molding using the aforementioned resin composition for encapsulating a semiconductor, and is characterized in that a diameter of the wire is not more than 18 μm and the wire sweep rate is not more than 2.5%.

For the semiconductor device of the present invention, a thickness of a cured product of the resin composition for encapsulating a semiconductor on the semiconductor element may be not more than 150 μm.

According to the present invention, in case that a semiconductor device is obtained by encapsulating a semiconductor element by compression molding, it is possible to obtain a resin composition for encapsulating a semiconductor in which the yield rate during compression molding and the quality of a semiconductor device is enhanced.

BRIEF DESCRIPTION OF THE DRAWINGS

The above and other objects, features and advantages will be apparent from the following detailed description of the preferred embodiments in conjunction with the accompanying drawings.

DESCRIPTION OF EMBODIMENTS

The resin composition for encapsulating a semiconductor of the present invention is a granular resin composition for encapsulating a semiconductor used for a semiconductor device obtained by encapsulating a semiconductor element by compression molding, and is characterized as follows that, on condition that ion viscosity is measured with a dielectric analyzer under a measurement temperature of 175° C. and a measurement frequency of 100 Hz, the time from the initiation of the measurement until a decrease of the ion viscosity to the lowest ion viscosity is 20 seconds or shorter, the lowest ion viscosity value is not more than 6.5, and the time interval between the time from the initiation of the measurement until a decrease of the ion viscosity to the lowest ion viscosity and the time from the initiation of the measurement until the ion viscosity reaching 90% of an ion viscosity value measured at 300 seconds is 10 seconds or longer. Furthermore, the method for producing a semiconductor device of the present invention is characterized in that a semiconductor element is encapsulated by compression molding using the aforementioned granular resin composition for encapsulating a semiconductor. According to these constructions, in case that a semiconductor device is obtained by encapsulating a semiconductor element by compression molding using the granular resin composition for encapsulating a semiconductor, it is possible to provide a resin composition for encapsulating a semiconductor in which excellent filling properties are achieved, a short circuit failure in wires hardly occurs, and the yield rate during compression molding and the quality of a semiconductor device are enhanced, and a method for producing a semiconductor device using the resin composition. The present invention will be described in detail below.

Figure 1:
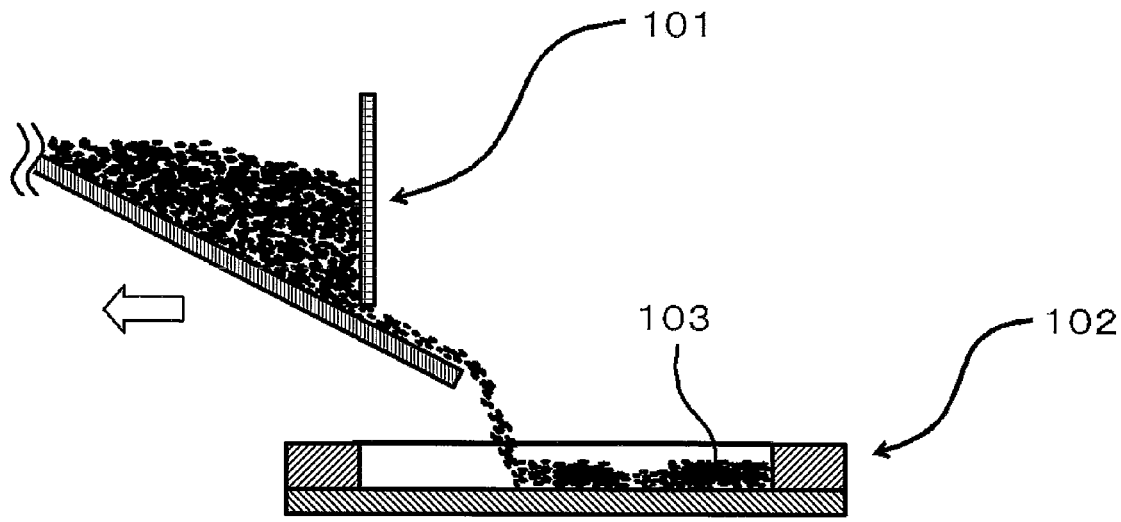
FIG. 1 is a schematic diagram of one example from conveyance to weighing in a method for obtaining a semiconductor device obtained by encapsulating a semiconductor element by compression molding using a granular resin composition.
Figure 2:
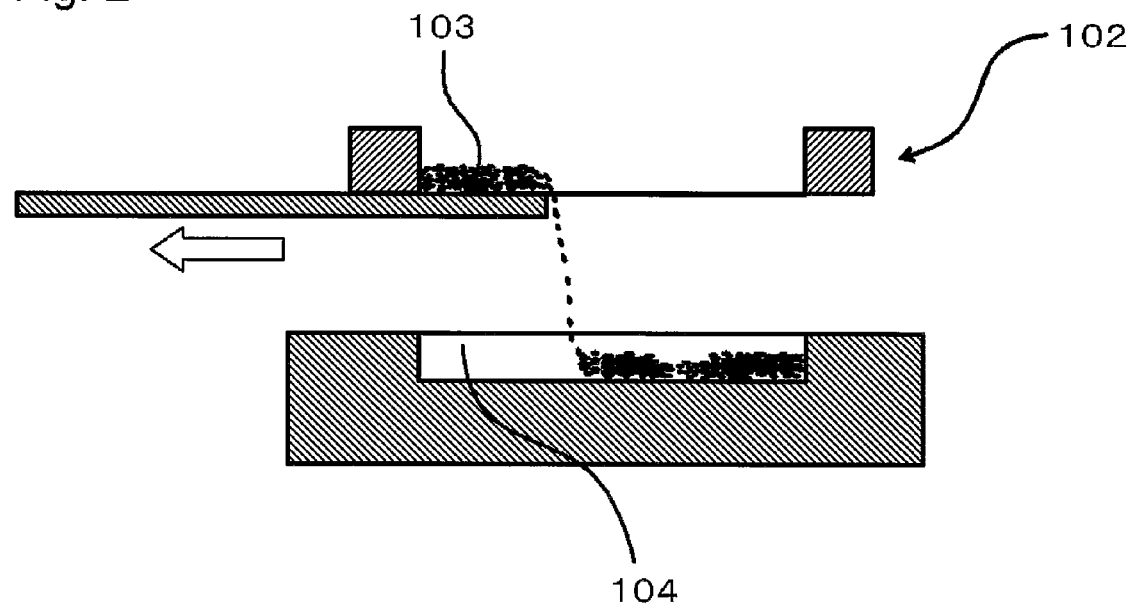
FIG. 2 is a schematic diagram of one example of a method of supplying a granular resin composition into a lower cavity of a mold in a method for obtaining a semiconductor device obtained by encapsulating a semiconductor element by compression molding using the granular resin composition.

First, one example of a method for obtaining a semiconductor device obtained by encapsulating a semiconductor element by compression molding using the granular resin composition of the present invention will be described in more detail with reference to FIGS. 1 and 2 illustrating a schematic diagram of a method of weighing the granular resin composition and supplying it into a mold cavity. A granular resin composition 103 is conveyed in a predetermined quantity using a conveyance means such as a vibration feeder 101 or the like onto a resin material supplying container 102 equipped with a resin material supplying mechanism such as a shutter or the like capable of supplying the resin composition into a lower cavity 104 in an instant, whereby the resin material supplying container 102 containing the granular resin composition 103 is prepared (see FIG. 1). At this time, the granular resin composition 103 contained in the resin material supplying container 102 can be weighed by a weighing means arranged below the resin material supplying container 102. Next, the resin material supplying container 102 containing the granular resin composition 103 is arranged between an upper die and a lower die of a compression mold, and a lead frame or a circuit board on which a semiconductor element is mounted is fixed on the upper die of the compression mold by a fixing means such as a clamp, adsorption or the like such that a semiconductor element-mounted surface is directed downward (not illustrated). Subsequently, when the weighed granular resin composition 103 is supplied into the lower cavity 104 by use of the resin material supplying mechanism such as a shutter or the like constituting the bottom surface of the resin material supplying container 102 (see FIG. 2), the granular resin composition 103 is melted in the lower cavity 104 at a predetermined temperature. Furthermore, after the resin material supplying container 102 is taken out of the mold, while reducing the pressure in the cavity as necessary, the mold is closed by use of a compression molding machine, the inside of the cavity is filled with the melted resin composition so as to surround the semiconductor element, and the resin composition is further cured for a predetermined period of time, whereby the semiconductor element is encapsulated and molded. After elapsing the predetermined period of time, the semiconductor device is taken out by opening the mold. Incidentally, it is not essentially required to perform degassing by reducing the pressure in the cavity, but degassing is preferable because voids in the cured product of the resin composition are reduced. Furthermore, a plurality of semiconductor elements may be mounted on the lead frame or the circuit board, and may be laminated or mounted in parallel thereon.

In addition to the above cases, in the case of a compression molding method including encapsulating a semiconductor element using a granular resin composition, the granular resin composition in use is desired to have uniform putting of the granular resin composition into a lower cavity of a compression mold, weighing accuracy of the granular resin composition put into the lower cavity of the compression mold, proper flowability in molding and curability, in order to enhance the yield rate during compression molding and the quality of a semiconductor device. When preparation of putting and weighing of the granular resin composition are carried out using a conveyance means such as a vibration feeder or the like, the granular resin composition is demanded to be uniformly supplied by vibration (hereinafter also referred to as conveyance performance).

The compression molding is different from injection molding and transfer molding, and is a molding method without applying much shearing force onto the resin composition due to kneading, flowing or the like. When a material in use is a granular resin composition, the viscosity and curability are changed depending on the particle size distribution as well.

For this reason, in the present invention, as a method of evaluating the viscosity characteristics and flowability of the resin composition for encapsulating a semiconductor, the time until a decrease of the ion viscosity to the lowest ion viscosity, the lowest ion viscosity and the time interval between the time until a decrease of the ion viscosity to the lowest ion viscosity and the time from the initiation of the measurement until the ion viscosity reaching 90% of an ion viscosity value relative to the highest value of the ion viscosity (hereinafter simply referred to as the highest value in some cases) measured at 300 seconds are used when the ion viscosity is measured with a dielectric analyzer. Accordingly, the molding status during compression molding using the granular resin composition is appropriately re-created. In the past, a spiral flow, a Koka's flow, a Brabender, a Labo Plastomill or the like has been used as a means of evaluating viscosity characteristics and flowability of a resin composition for encapsulating a semiconductor. However, all of these evaluation means exhibiting resin viscosity behavior during flowing could not properly represent the essence of compression molding and viscosity behavior with no shear, that is, acceleration of the reaction caused by a collision among molecules or a delay in curing due to cutting of molecules take place due to a shearing force applied to the resin, so that compression molding status could not be properly ascertained.

Figure 3:
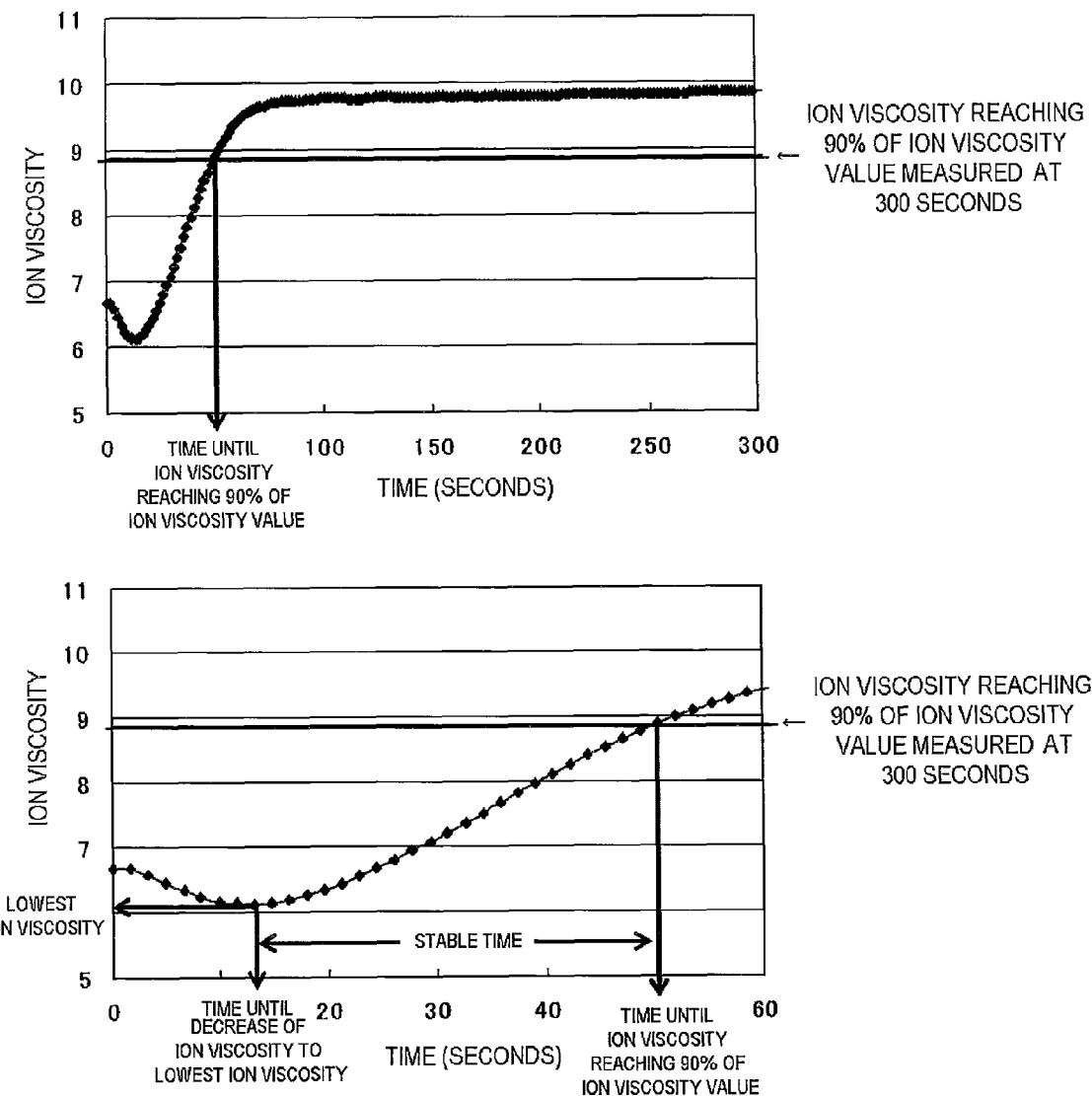
FIG. 3 is a graph showing the profiles of the ion viscosity and the slope obtained in case that a resin composition for encapsulating a semiconductor according to the present invention is measured with a dielectric analyzer.

The ion viscosity characteristics in case that the resin composition for encapsulating a semiconductor is measured with a dielectric analyzer are an indicator representing viscosity characteristics and the curing behavior of the granular resin composition for encapsulating a semiconductor, and these values are suitable for use in evaluation of viscosity characteristics and the curing behavior of the granular resin composition substantially at no shear state close to the molding status in the compression molding. FIG. 3 is a graph showing the profiles of the ion viscosity and the slope obtained in case that a resin composition for encapsulating a semiconductor according to the present invention is measured with a dielectric analyzer. The ion viscosity becomes the lowest value at the stage in which the entire resin has melted, and the ion viscosity increases as the epoxy resin composition is cured. The time until a decrease of the ion viscosity to the lowest ion viscosity (hereinafter also referred to as the time until the ion viscosity reaching the lowest ion viscosity) is an indicator representing the ease of melting of the granular resin composition, and the lowest ion viscosity value is an indicator representing the lowest viscosity of the granular resin composition. Furthermore, the time interval between the time until a decrease of the ion viscosity to the lowest ion viscosity and the time until the ion viscosity reaching 90% of an ion viscosity value relative to the highest value (hereinafter referred as the stable time) are each an indicator representing the time width of the granular resin composition having flowability.

In case that the resin composition for encapsulating a semiconductor of the present invention is measured with a dielectric analyzer under a measurement temperature of 175° C. and a measurement frequency of 100 Hz, the time from the initiation of the measurement until a decrease of the ion viscosity to the lowest ion viscosity is preferably 20 seconds or shorter and more preferably 15 seconds or shorter. When the time until a decrease of the ion viscosity to the lowest ion viscosity is not more than the above upper limit, even in case of a wire diameter of not more than 18 μm, almost no wire flow (wire sweep rate of not more than 2.5%) occurs by sufficiently lowering the resin viscosity when the resin is brought into contact with wires of a semiconductor device, and as a result, occurrence of a short circuit failure in fine pitch wires can be suppressed. On the other hand, the lower limit of the time until a decrease of the ion viscosity to the lowest ion viscosity is not particularly limited, but it is preferably 2 seconds or longer and more preferably 5 seconds or longer in consideration of occurrence of partial gelation and uneven curing, as only the resin part which is come into contact with the cavity of the compression mold is antecedently melted and cured.

In case that the resin composition for encapsulating a semiconductor of the present invention is measured with a dielectric analyzer under a measurement temperature of 175° C. and a measurement frequency of 100 Hz, the lowest ion viscosity value is preferably not more than 6.5 and more preferably not more than 6.3. When the lowest ion viscosity value is not more than the above upper limit, even in case of a wire diameter of not more than 18 μm, almost no wire flow (wire sweep rate of not more than 2.5%) occurs, and as a result, occurrence of a short circuit failure in fine pitch wires can be suppressed. The lower limit of the lowest ion viscosity value is not particularly limited, but it is preferably not less than 1 and more preferably not less than 3 in consideration of occurrence of burr in an air vent portion or a parting line, as the resin viscosity becomes excessively lowered. Herein, the lowest ion viscosity value refers to the lowest value of the ion viscosity value from the initiation of the measurement to 300 seconds.

In case that the resin composition for encapsulating a semiconductor of the present invention is measured with a dielectric analyzer under a measurement temperature of 175° C. and a measurement frequency of 100 Hz, the time interval between the time from the initiation of the measurement until a decrease of the ion viscosity to the lowest ion viscosity and the time from the initiation of the measurement until the ion viscosity reaching 90% of an ion viscosity value measured at 300 seconds is preferably 10 seconds or longer and more preferably 14 seconds or longer. In case that the time interval between the time from the initiation of the measurement until a decrease of the ion viscosity to the lowest ion viscosity and the time from the initiation of the measurement until the ion viscosity reaching 90% of an ion viscosity value measured at 300 seconds is not less than the above lower limit, there is little or no risk of causing defective filling or voids due to resin thickening in the course of molding. Furthermore, the upper limit of the time interval between the time from the initiation of the measurement until a decrease of the ion viscosity to the lowest ion viscosity and the time from the initiation of the measurement until the ion viscosity reaching 90% of anion viscosity value measured at 300 seconds is not particularly limited, but it is preferably 120 seconds or shorter and more preferably 60 seconds or shorter considering that the mold is severely contaminated as the curability is lowered, the productivity is lowered due to increased frequency of cleaning, or heat resistance and moisture resistance of a cured product are worsened.

Incidentally, as the dielectric analyzer, a DEA231/1 cure analyzer manufactured by NETZSCH can be used, and as a press, an MP235 Mini-Press manufactured by NETZSCH can be used. Further, the measurement can be performed in accordance with ASTM E2039.

In case that the resin composition for encapsulating a semiconductor of the present invention is measured with a dielectric analyzer under a measurement temperature of 175° C. and a measurement frequency of 100 Hz, the time from the initiation of the measurement until a decrease of the ion viscosity to the lowest ion viscosity is 20 seconds or shorter, the lowest ion viscosity value is not more than 6.5, and the time interval between the time from the initiation of the measurement until a decrease of the ion viscosity to the lowest ion viscosity and the time from the initiation of the measurement until the ion viscosity reaching 90% of an ion viscosity value measured at 300 seconds is 10 seconds or longer. Such a resin composition can be obtained by adjusting the kind of the epoxy resin, the curing agent and the curing accelerator, and the mixing ratio thereof, the particle size distribution of the granular resin composition for encapsulating a semiconductor, and the like.

In the particle size distribution as determined by sieving the granular resin composition for encapsulating a semiconductor of the present invention using JIS standard sieves, microfine particles having a particle diameter of less than 106 μm is contained preferably at a ratio of not more than 5% by mass and more preferably at a ratio of not more than 3% by weight, based on the whole resin composition. In case that the ratio of microfine particles having a particle diameter of less than 106 μm is not more than the above upper limit, at the stage of conveying and weighing, stabilized conveyance performance and excellent weighing accuracy can be achieved without causing aggregation or adhesion on the conveyance path of the conveyance means such as a vibration feeder or the like, or attachment to the conveyance means. On the other hand, In case that the ratio of microfine particles having a particle diameter of less than 106 μm is not more than the above upper limit, microfine particles are not relatively antecedently melted and cured, and the time interval between the time until a decrease of the ion viscosity to the lowest ion viscosity and the time until the ion viscosity reaching 90% of an ion viscosity value relative to the highest value is easily in the proper range on condition that ion viscosity is measured with a dielectric analyzer under a measurement temperature of 175° C. and a measurement frequency of 100 Hz; therefore such a ratio is preferred. Also, in case that the ratio of microfine particles having a particle diameter of less than 106 μm is not more than the above upper limit, at the molding stage, there is little risk of causing partial gelation or uneven curing as microfine particles having a particle diameter of less than 106 μm are relatively antecedently melted and cured. In addition, the lower limit of the ratio of microfine particles having a particle diameter of less than 106 μm is not particularly limited, and it may be 0% by mass.

In the particle size distribution as determined by sieving the granular resin composition for encapsulating a semiconductor of the present invention using JIS standard sieves, the ratio of coarse particles having a size of 2 mm or greater is preferably not more than 3% by mass and more preferably not more than 2% by mass, based on the whole resin composition. In case the ratio of coarse particles having a size of 2 mm or greater is not more than the above upper limit, at the stage of conveying and weighing, a weighing variation may not occur depending on mixing of particles having a large mass, excellent weighing accuracy can be achieved, and accordingly the quality of a semiconductor device after molding can be stabilized. Furthermore, in case that the ratio of coarse particles having a size of 2 mm or greater is not more than the above upper limit, melting and curing of coarse particles are not relatively delayed, and the time from the initiation of the measurement until a decrease of the ion viscosity to the lowest ion viscosity is easily in the proper range in case that ion viscosity is measured with a dielectric analyzer under a measurement temperature of 175° C. and a measurement frequency of 100 Hz; therefore, such a ratio is also preferred. In case that the ratio of coarse particles having a size of 2 mm or greater is not more than the above upper limit, at the molding stage, there is little risk of causing uneven curing or partial wire sweep as melting and curing of coarse particles having a size of 2 mm or greater are relatively delayed. Furthermore, the lower limit of the ratio of coarse particles having a size of 2 mm or greater is not particularly limited, and it may be 0% by mass.

As a method of measuring the particle size distribution of the granular resin composition, preferably used is a method including using JIS standard sieves having apertures of 2.00 mm, 1.00 mm and 106 μm installed in a ro-tap type sieve shaker, classifying a sample of 40 g through the sieves while shaking these sieves over a period of 20 minutes (number of hammer strokes: 120/minute) and determining % by mass of particles remained on the sieves of 2.00 mm and 1.00 mm and % by mass of microfine particles passing through the sieve of 106 μm, based on the total sample mass before classifying because properties necessary for actual compression molding are realized. In the case of this method, particles having a high aspect ratio are possibly passing through respective sieves, whereas, for convenience, respective particle size distributions of the granular resin composition of the present invention are defined according to % by mass of the components classified under the above certain conditions.

Furthermore, the resin composition for encapsulating a semiconductor for compression molding which has been used from the past was a pulverized product obtained by premixing respective raw material components using a mixer, and then kneading with heating by use of a kneading machine such as a roller, a kneader, an extruder or the like, followed by cooling and pulverizing, wherein in the particle size distribution as determined by sieving the whole resin composition using JIS standard sieves, the amount of microfine particles having a size of less than 106 μm exceeded 10% by mass, and the amount of coarse particles having a size of 2 mm or greater was about 4% by mass to 6% by mass, and the resin composition had a wide particle size distribution. Also, as an example of the pulverized product of the conventional resin composition for encapsulating a semiconductor for compression molding, as described in Japanese Patent Application Laid-Open No. 2000-021908 (Patent Document 1), "an epoxy resin molding material is coarse particles obtained by cutting pulverized fine powder or granules obtained by solidifying fine powder" (paragraph 0010 of Patent Document 1). According to Examples of the document, the granular resin composition for encapsulating a semiconductor was, for example, nearly spherical with an average particle diameter of about 2 mm, and was coarse particles having an average particle diameter of about 3 mm obtained by pulverizing a kneaded product and cutting microfine particles having a particle diameter of not more than 1 mm of the pulverized product, or the like. That is, the epoxy resin molding material described in Patent Document 1 contained coarse particles having a size of 2 mm or greater in a significant amount. In addition, it is considered that there was no description of cutting of coarse particles having a size of 2 mm or greater in the document, and this cutting step was not added either in view of the productivity.

Meanwhile, in compression molding, there is no need to flow-inject the resin for filing the chip with the resin, differently from transfer molding. Since flowing of the resin in the lateral direction in the cavity is small, even in a package of a narrow gap structure having a thin thickness of the resin on the chip, for example, a package of a narrow gap structure having a thickness of the resin on the chip of 80 μm to 150 μm, which was difficult in transfer molding, the package can be molded with good yield rate without causing failures such as wire sweep and defective filling by selecting a proper resin composition for compression molding. As the resin composition for compression molding which can also be applied to such a package of a narrow gap structure, more preferably used are those in which, on condition that ion viscosity is measured with a dielectric analyzer under a measurement temperature of 175° C. and a measurement frequency of 100 Hz, the time from the initiation of the measurement until a decrease of the ion viscosity to the lowest ion viscosity is 15 seconds or shorter, the lowest ion viscosity value is not more than 6.3, and the time interval between the time until a decrease of the ion viscosity to the lowest ion viscosity and the time until the ion viscosity reaching 90% of an ion viscosity value relative to the highest value is 14 seconds or longer. Further, there is the risk of exposing wires in case a gap on the chip is not more than 80 μm.

In the resin composition for encapsulating a semiconductor of the present invention, an epoxy resin is used. The epoxy resin used for the resin composition of the present invention may generally be monomers, oligomers, and polymers having two or more epoxy groups in one molecule. The molecular weight and molecular structure thereof are not particularly limited, and examples include crystalline epoxy resins such as a biphenyl type epoxy resin, a bisphenol A type epoxy resin, a bisphenol F type epoxy resin, a stilbene type epoxy resin, a hydroquinone type epoxy resin and the like; novolac type epoxy resins such as a cresol novolac type epoxy resin, a phenol novolac type epoxy resin, a naphthol novolac type epoxy resin and the like; phenol aralkyl type epoxy resins such as a phenol aralkyl type epoxy resin having a phenylene structure, a phenol aralkyl type epoxy resin having a biphenylene structure, a naphthol aralkyl type epoxy resin having a phenylene structure and the like; trifunctional epoxy resins such as a triphenolmethane type phenol resin, an alkyl-modified triphenolmethane type phenol resin and the like; modified phenol type epoxy resins such as a dicyclopentadiene-modified phenol type epoxy resin, a terpene-modified phenol type epoxy resin and the like; and heterocyclic ring-containing epoxy resins such as a triazine nucleus-containing epoxy resin and the like. These may be used alone or in combination of two or more kinds. Among these, suitably used are a biphenyl type epoxy resin, a bisphenol A type epoxy resin, a bisphenol F type epoxy resin, a phenol aralkyl type epoxy resin having a biphenylene structure, and a dicyclopentadiene-modified phenol type epoxy resin. Furthermore, in case that the resin composition is measured with a dielectric analyzer under a measurement temperature of 175° C. and a measurement frequency of 100 Hz, the time from the initiation of the measurement until a decrease of the ion viscosity to the lowest ion viscosity is 20 seconds or shorter, the lowest ion viscosity value is not more than 6.5, and the time interval between the time from the initiation of the measurement until the ion viscosity reaching 90% of an ion viscosity value measured at 300 seconds and the time from the initiation of the measurement until a decrease of the ion viscosity to the lowest ion viscosity is 10 seconds or longer. In view of the range satisfying the above requirements, preferably used are those having a biphenyl structure in the molecular structure and an epoxy equivalent of not less than 180.

The lower limit of the mixing ratio of the whole epoxy resin is not particularly limited, but it is preferably not less than 2% by mass and more preferably not less than 4% by mass, based on the total resin composition. In case that the lower limit of the mixing ratio is within the above range, there is little risk of causing deterioration of the flowability or the like. The upper limit of the mixing ratio of the whole epoxy resin is not particularly limited either, but it is preferably not more than 15% by mass and more preferably not more than 13% by mass, based on the total resin composition. In case that the upper limit of the mixing ratio is within the above range, there is little risk of causing deterioration of solder resistance or the like. Furthermore, in consideration of the time until a decrease of the ion viscosity to the lowest ion viscosity, the lowest ion viscosity, and the time interval between the time until the ion viscosity reaching 90% of an ion viscosity value relative to the highest value and the time until a decrease of the ion viscosity to the lowest ion viscosity, in case that ion viscosity is measured with a dielectric analyzer, it is preferable that the mixing ratio is properly adjusted depending on the kind of the epoxy resin in use.

In the resin composition for encapsulating a semiconductor of the present invention, a curing agent is used. The curing agent used for the resin composition of the present invention is not particularly limited as long as it is cured by reacting with an epoxy resin, and examples thereof include straight chain aliphatic diamines having 2 to 20 carbon atoms such as ethylenediamine, trimethylenediamine, tetramethylenediamine, hexamethylenediamine and the like; amines such as m-phenylenediamine, p-phenylenediamine, p-xylenediamine, 4,4-diaminodiphenylmethane, 4,4-diaminodiphenylpropane, 4,4'-diaminodiphenyl ether, 4,4'-diaminodiphenyl sulfone, 4,4'-diaminodicyclohexane, bis(4-aminophenyl) phenylmethane, 1,5-diaminonaphthalene, m-xylyenediamine, p-xylenediamine, 1,1-bis(4-aminophenyl)cyclohexane, dicyanodiamide and the like; resol type phenolic resins such as an aniline-modified resol resin, a dimethyl ether resol resin and the like; phenolic novolac type resins such as a phenolic novolac resin, a cresol novolac resin, a tert-butylphenolic novolac resin, a nonylphenolic novolac resin and the like; polyoxystyrenes such as poly-p-oxystyrene and the like; and phenolic resins such as a phenol aralkyl resin and the like or acid anhydrides. These may be used alone or in combination of two or more kinds. Among these, suitably used are a phenolic novolac resin, a phenol aralkyl resin having a phenylene structure, a phenol aralkyl resin having a biphenylene structure and the like. Further, in case that the resin composition is measured with a dielectric analyzer under a measurement temperature of 175° C. and a measurement frequency of 100 Hz, the time from the initiation of the measurement until a decrease of the ion viscosity to the lowest ion viscosity is 20 seconds or shorter, the lowest ion viscosity value is not more than 6.5, and the time interval between the time from the initiation of the measurement until the ion viscosity reaching 90% of an ion viscosity value measured at 300 seconds and the time from the initiation of the measurement until a decrease of the ion viscosity to the lowest ion viscosity is 10 seconds or longer. In view of the range satisfying the above requirements, preferably used are those having a phenylene structure or a biphenyl structure in the molecular structure and a hydroxyl equivalent of not less than 160.

The lower limit of the mixing ratio of the total curing agent is not particularly limited, but it is preferably not less than 0.8% by mass and more preferably not less than 1.5% by mass, based on the total resin composition. In case that the lower limit of the mixing ratio is within the above range, sufficient flowability may be achieved. On the other hand, the upper limit of the mixing ratio of the whole curing agent is not particularly limited either, but it is preferably not more than 10% by mass and more preferably not more than 8% by mass, based on the total resin composition. In case that the upper limit of the mixing ratio is within the above range, excellent solder resistance may be achieved. Furthermore, in consideration of the time until a decrease of the ion viscosity to the lowest ion viscosity, the lowest ion viscosity, and the time interval between the time until the ion viscosity reaching 90% of an ion viscosity value relative to the highest value and the time until a decrease of the ion viscosity to the lowest ion viscosity, in case that ion viscosity is measured with a dielectric analyzer, it is preferable that the mixing ratio is properly controlled depending on the kind of the curing agent in use.

Meanwhile, in case that a phenolic resin curing agent is used as a curing agent, as the mixing ratio of all the epoxy resins to all the phenol resin curing agents, the equivalent ratio (EP)/(OH) of the number of epoxy groups (EP) of all the epoxy resins to the number of phenolic hydroxyl groups (OH) of all the phenol resin curing agents is preferably from 0.8 or more to 1.3 or less. In case that the equivalent ratio is within this range, sufficient curability may be achieved during molding of the resin composition. In case that the equivalent ratio is within this range, excellent properties in the resin cured product may be achieved. Furthermore, in consideration of a reduction of warpage in an area surface mount semiconductor package, the equivalent ratio (Ep/Ph) of the number of epoxy groups (Ep) of all the epoxy resins to the number of phenolic hydroxyl groups (Ph) of all the curing agents is preferably controlled depending on the kind of the curing accelerator in use such that curability of the resin composition and the glass transition temperature of the resin cured product or thermal time elastic modulus are improved. Furthermore, in consideration of the time until a decrease of the ion viscosity to the lowest ion viscosity, the lowest ion viscosity, and the time interval between the time until the ion viscosity reaching 90% of an ion viscosity value relative to the highest value and the time until a decrease of the ion viscosity to the lowest ion viscosity, in case that ion viscosity is measured with a dielectric analyzer, it is preferable that the equivalent ratio is properly controlled depending on the kind of the epoxy resin and the phenolic resin curing agent in use.

In the resin composition for encapsulating a semiconductor of the present invention, a curing accelerator is used. The curing accelerator used for the resin composition for encapsulating a semiconductor of the present invention may be good as long as it accelerates a curing reaction of an epoxy group with a phenolic hydroxyl group, and those used for an encapsulation material in general can be used. Examples thereof include diazabicycloalkene and derivatives thereof such as 1,8-diazabicyclo(5,4,0)undecene-7 and the like; amine compounds such as tributylamine, benzyldimethylamine and the like; imidazole compounds such as 2-methylimidazole and the like; organic phosphines such as triphenyl phosphine, methyldiphenyl phosphine and the like; tetra-substituted phosphonium tetra-substituted borate such as tetraphenyl phosphonium tetraphenyl borate, tetraphenyl phosphonium tetra benzoic acid borate, tetraphenyl phosphonium tetra naphthoic acid borate, tetraphenyl phosphonium tetra naphthoyl oxy borate, tetraphenyl phosphonium tetra naphthyl oxy borate and the like; and triphenyl phosphine with benzoquinone added thereto. These may be used alone or in combination of two or more kinds. Among these, suitably used are phosphorus atom-containing compounds such as a tetra-substituted phosphonium compound, a phosphobetaine compound, an adduct of a phosphine compound and a quinone compound, an adduct of a phosphonium compound and a silane compound, and the like. Also, In case that the resin composition is measured with a dielectric analyzer under a measurement temperature of 175° C. and a measurement frequency of 100 Hz, the time from the initiation of the measurement until a decrease of the ion viscosity to the lowest ion viscosity is 20 seconds or shorter, the lowest ion viscosity value is not more than 6.5, and the time interval between the time from the initiation of the measurement until the ion viscosity reaching 90% of an ion viscosity value measured at 300 seconds and the time from the initiation of the measurement until a decrease of the ion viscosity to the lowest ion viscosity is 10 seconds or longer. In view of the range satisfying the above requirements, preferably used is a curing accelerator having latency which becomes excellent in a balance among low viscosity, thermal stability and curability.

The lower limit of the mixing ratio of the whole curing accelerator is preferably not less than 0.1% by mass in the total resin composition. In case that the lower limit of the mixing ratio of the whole curing accelerator is within the above range, sufficient curability may be achieved. The upper limit of the mixing ratio of the whole curing accelerator is preferably not more than 1% by mass in the total resin composition. In case that the upper limit of the mixing ratio of the whole curing accelerator is within the above range, sufficient flowability may be achieved. Furthermore, in consideration of the time until a decrease of the ion viscosity to the lowest ion viscosity, the lowest ion viscosity, and the time interval between the time until the ion viscosity reaching 90% of an ion viscosity value relative to the highest value and the time until a decrease of the ion viscosity to the lowest ion viscosity, in case that ion viscosity is measured with a dielectric analyzer, it is preferable that the mixing ratio is properly controlled depending on the kind of the curing accelerator in use.

In the resin composition for encapsulating a semiconductor of the present invention, an inorganic filler is used. The inorganic filler used for the resin composition for encapsulating a semiconductor of the present invention is not particularly limited as long as it is generally used for a semiconductor encapsulation material, and examples include silica such as molten crushed silica, molten spherical silica, crystal silica, secondary aggregated silica and the like; alumina; titanium white; aluminum hydroxide; talc; clay; mica; glass fiber and the like. Among these, particularly preferably used is molten spherical silica. It is preferable that the particle shape is infinitely nearly spherical. Furthermore, the amount of the inorganic filler may be increased by mixing particles having different sizes. in case that the resin composition is measured with a dielectric analyzer under a measurement temperature of 175° C. and a measurement frequency of 100 Hz, the time from the initiation of the measurement until a decrease of the ion viscosity to the lowest ion viscosity is 20 seconds or shorter, the lowest ion viscosity value is not more than 6.5, and the time interval between the time from the initiation of the measurement until the ion viscosity reaching 90% of an ion viscosity value measured at 300 seconds and the time from the initiation of the measurement until a decrease of the ion viscosity to the lowest ion viscosity is 10 seconds or longer. In view of the range satisfying the above requirements, preferably used is molten spherical silica.

The lower limit of the ratio of the inorganic filler is preferably not less than 78% by mass, more preferably not less than 80% by mass and particularly preferably not less than 83% by mass, based on the total resin composition. in case that the lower limit of the ratio of the inorganic filler is within the above range, as physical properties of a cure product of the resin composition, excellent solder cracking resistance may be achieved without increasing the amount of moisture absorption and without reducing strength. Furthermore, the upper limit of the ratio of the inorganic filler is preferably not more than 93% by mass, more preferably not more than 91% by mass and particularly preferably not more than 90% by mass, based on the total resin composition. In case that the upper limit of the ratio of the inorganic filler is within the above range, excellent moldability may be achieved without impairing the flowability. Furthermore, in case that the resin composition is measured with a dielectric analyzer under a measurement temperature of 175° C. and a measurement frequency of 100 Hz, the time from the initiation of the measurement until a decrease of the ion viscosity to the lowest ion viscosity is 20 seconds or shorter, the lowest ion viscosity value is not more than 6.5, and the time interval between the time from the initiation of the measurement until the ion viscosity reaching 90% of an ion viscosity value measured at 300 seconds and the time from the initiation of the measurement until a decrease of the ion viscosity to the lowest ion viscosity is 10 seconds or longer. In view of the range satisfying the above requirements, the content of the inorganic filler is preferably set to be lower in the ranges in which excellent solder resistance is obtained.

The resin composition for encapsulating a semiconductor of the present invention, in addition to the aforementioned components, may contain, as necessary, various additives such as coupling agents such as γ-glycidoxypropyltrimethoxysilane and the like; coloring agents such as carbon black and the like; release agents such as natural wax, synthesized wax, a higher fatty acid or a metal salt thereof, paraffin and the like; low stress components such as silicone oil, silicone rubber and the like; and anti-oxidants.

Next, the method for obtaining a resin composition for encapsulating a semiconductor of the present invention will be described. The resin composition for encapsulating a semiconductor of the present invention can be obtained according to a method including melt kneading a mixture obtained by uniformly mixing the aforementioned components, other additives or the like using, for example, a mixer or the like at an ordinary temperature using a kneading machine such as a hot roller, a kneader, an extruder or the like, following by cooling and pulverizing, and removing coarse particles and microfine particles using sieves (hereinafter also referred to as the pulverizing-sieving method), a method including making a melt-kneaded resin composition into granules, or the like. Preferably used is a method of granulating in view of the yield rate in the production of the resin composition. As a method of granulating, there are a method including using an extruder having a die with a plurality of small pores at the front end of the screw and cutting a molten resin extruded from small pores arranged at the die in a strand form using a cutter slidingly rotating almost in parallel to the die surface (hereinafter also referred to as the a hot-cutting method) and the like. However, in consideration of a problem of entrainment of friction metal powder or the like, preferably used is a method for obtaining a granular resin composition for encapsulating a semiconductor by supplying a melt-kneaded resin composition to the inside of a rotor composed of a cylindrical outer peripheral portion having a plurality of small pores and a disk-shaped bottom surface in which a temperature is adjusted by use of a direct or indirect heating means in a molten state, and allowing the resin composition to pass through small pores by centrifugal force obtained by the rotation of the rotor (hereinafter also referred to as the centrifugal powdering method). The granular resin composition for encapsulating a semiconductor can be obtained by adjusting proper production conditions in this method, wherein, in the particle size distribution as determined by sieving using JIS standard sieves, the ratio of microfine particles having a particle diameter of less than 106 μm is not more than 5% by mass, relative to the whole resin composition for encapsulating a semiconductor and the ratio of coarse particles having a particle diameter of 2 mm or greater is not more than 3% by mass, relative to the total resin composition for encapsulating a semiconductor.

Figure 4:
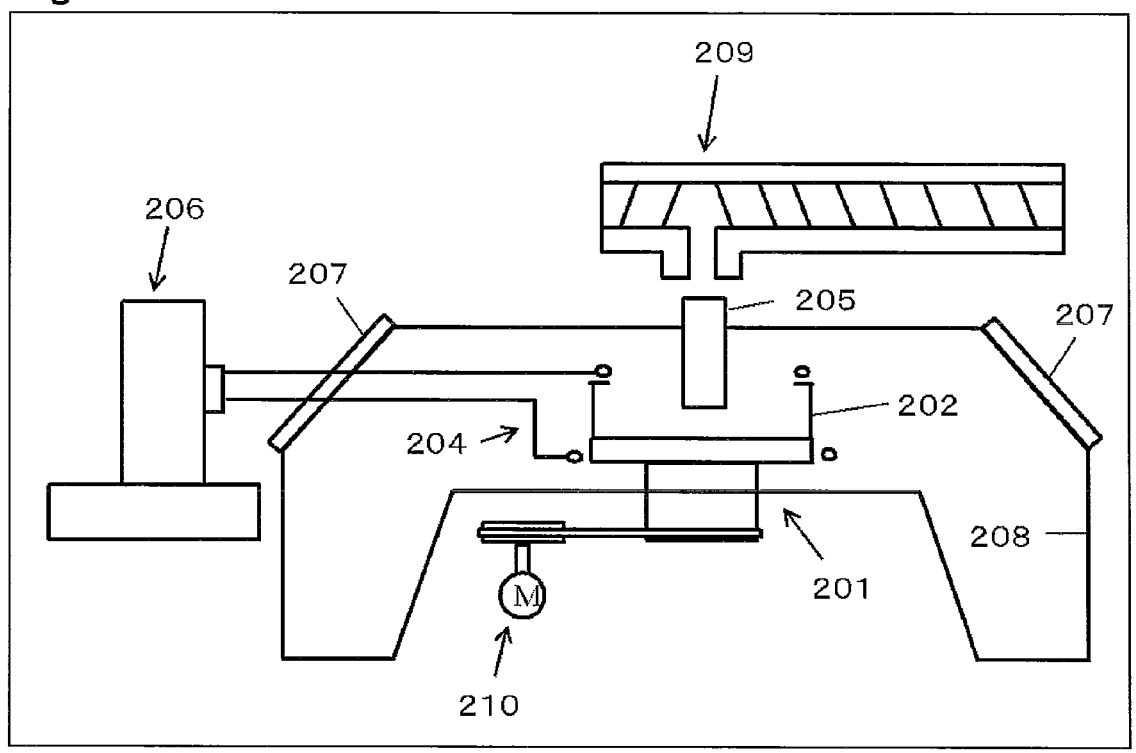
FIG. 4 is a schematic diagram of one example from melt kneading of a resin composition to collection of a granular resin composition in order to obtain the granular epoxy resin composition for encapsulating a semiconductor of the present invention.
Figure 5:
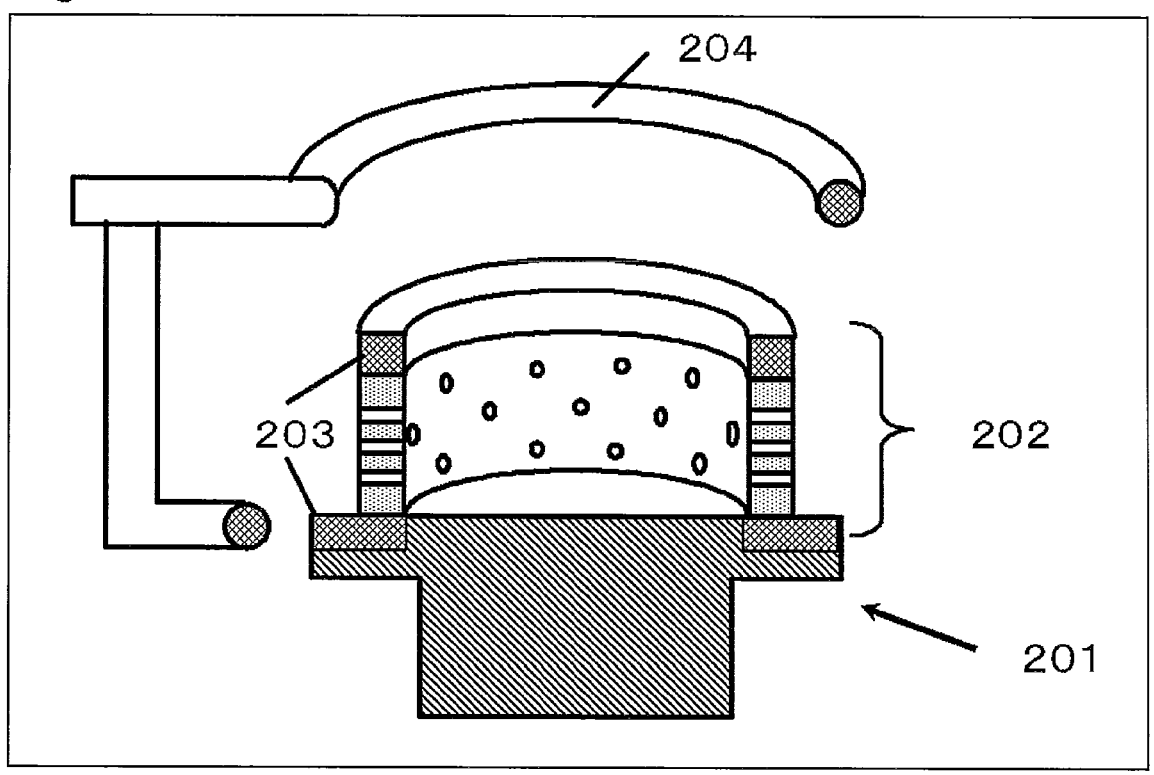
FIG. 5 is a cross-sectional view of one example of an exciting coil in order to heat a rotor used in the present invention and a cylindrical outer peripheral portion of the rotor.
Figure 6:
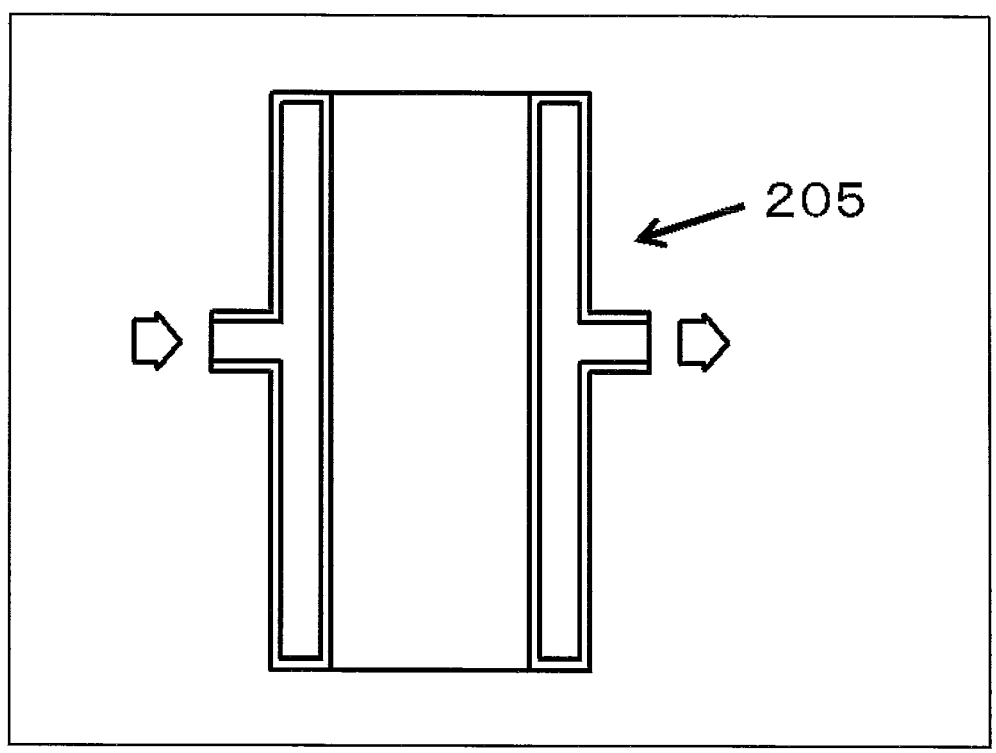
FIG. 6 is a cross-sectional view of one example of a double tube cylindrical body for supplying the melt-kneaded resin composition to a rotor.

Next, the centrifugal powdering method, one example of a production method for obtaining the epoxy resin composition for encapsulating a semiconductor of the present invention, will be described in more detail with reference to the drawings. FIG. 4 is illustrates a schematic diagram of one example from melt kneading of a resin composition until collection of a granular resin composition in order to obtain a granular epoxy resin composition for encapsulating a semiconductor. FIG. 5 illustrates a cross-sectional view of one example of an exciting coil for heating a rotor and a cylindrical outer peripheral portion of the rotor. FIG. 6 illustrates a cross-sectional view of one example of a double tube cylindrical body for supplying the melt-kneaded resin composition to the rotor.

The epoxy resin composition which is melt-kneaded at a twin screw extruder 209 is supplied to the inside of a rotor 201 through a double tube cylindrical body 205 cooled by a coolant between an inner wall and an outer wall. At this time, it is preferable that the double tube cylindrical body 205 is cooled using a coolant such that the melt-kneaded epoxy resin composition is not attached to a wall of the double tube cylindrical body 205. Even when the epoxy resin composition is continuously supplied in a filamentous shape by supplying the epoxy resin composition to the rotor 201 through the double tube cylindrical body 205, the epoxy resin composition can be stably supplied without overflowing from the rotor 201 by the rotation of the rotor 201 at a high speed.

The rotor 201 is connected to a motor 210 and can be rotated at an arbitrary number of rotations. A cylindrical outer peripheral portion 202 having a plurality of small pores arranged on the outer periphery of the rotor 201 is provided with a magnetic material 203, and is heated by the eddy current loss or the hysteresis loss accompanied by passing of an alternating magnetic flux generated by electrically connecting an AC power supply generated by means of an AC power supply generating device 206 to an exciting coil 204 arranged in the vicinity. Examples of the magnetic material 203 include an iron material, silicon steel and the like. One or two or more of the magnetic materials 203 may be used in combination. The vicinity of small pores of the cylindrical outer peripheral portion 202 having a plurality of small pores may not be formed of the same material as the magnetic material 203, and may be formed, for example, of a nonmagnetic material having a high thermal conductivity. So, the vicinity of small pores of the cylindrical outer peripheral portion 202 can also be heated by heat conduction from the heated magnetic material 203 as a heat source by having the magnetic material 203 at its upper and lower portions. Examples of the nonmagnetic material include copper, aluminum and the like, and one or two or more of the nonmagnetic materials may be used in combination. The epoxy resin composition is supplied to the inside of the rotor 201, and then flies to the heated cylindrical outer peripheral portion 202 by centrifugal force obtained by the rotation of the rotor 201 using the motor 210.

The epoxy resin composition which is brought into contact with the heated cylindrical outer peripheral portion 202 having a plurality of small pores easily passes through small pores of the cylindrical outer peripheral portion 202 and is discharged without causing an increase of the melt viscosity. The heating temperature may be arbitrarily set depending on the properties of the epoxy resin composition in use. In general, when the heating temperature is excessively increased, curing of the epoxy resin composition proceeds so that the flowability is reduced or small pores of the cylindrical outer peripheral portion 202 are clogged in some cases. However, in the case of the proper temperature condition, the contact time of the resin composition with the cylindrical outer peripheral portion 202 is extremely short, so that an effect on the flowability is extremely small. The cylindrical outer peripheral portion 202 having a plurality of small pores is evenly heated, so that partial change in the flowability is extremely small. Also, the plurality of small pores of the cylindrical outer peripheral portion 202 can be arbitrarily adjusted in association with the particle shape and the particle size distribution of the resin composition in use.

The granular resin composition which is discharged through small pores of the cylindrical outer peripheral portion 202 is collected, for example, at an outer tank 208 installed on the periphery of the rotor 201. It is preferable that the outer tank 208 is installed such that a collision surface against which the granular epoxy resin composition passing through small pores of the cylindrical outer peripheral portion 202 and flying collides has a slop of from 10 to 80 degrees and preferably 25 to 65 degrees to the flying direction of the granular epoxy resin composition, in order to prevent attachment of the granular epoxy resin composition onto the inner wall and fusion among the granular epoxy resin compositions. When the slope of the collision surface relative to the flying direction of the epoxy resin composition is not more than the above upper limit, the collision energy of the granular epoxy resin composition can be fully dispersed, so that there is little risk of causing attachment onto the wall surface. On the other hand, when the slope of the collision surface relative to the flying direction of the epoxy resin composition is not less than the above lower limit, the flying speed of the granular epoxy resin composition can be fully reduced, so that, even in the case of secondary collision against the wall surface of the outer tank, there is little risk of causing attachment onto its exterior wall surface.

Meanwhile, when the temperature at the collision surface against which the granular epoxy resin composition collides becomes high, the granular epoxy resin composition is easily attached, so that it is preferable that a cooling jacket 207 is arranged on the periphery of the collision surface for cooling the collision surface. The inner diameter of the outer tank 208 preferably has such a size that the granular epoxy resin composition is fully cooled, thus preventing attachment of the granular epoxy resin composition onto the inner wall and fusion among the granular epoxy resin compositions. In general, air flows by the rotation of the rotor 201, so that a cooling effect is obtained. However, cold wind may be introduced, as necessary. The size of the outer tank 208 is varied depending on the amount of the resin to be treated. However, for example, in case that the diameter of the rotor 201 is 20 cm, attachment and fusion can be prevented as long as the inner diameter of the outer tank 208 is about 100 cm.

Then, the semiconductor device of the present invention obtained by encapsulating a semiconductor element by compression molding using the granular resin composition for encapsulating a semiconductor will be illustrated. Incidentally, the method for obtaining a semiconductor device obtained by encapsulating a semiconductor element by compression molding using the granular resin composition of the present invention is the same as mentioned above. The semiconductor element encapsulated in the semiconductor device of the present invention is not particularly limited, and examples include integrated circuits, large scale integrated circuits, transistors, thyristors, diodes and the like.

The shape of the semiconductor device of the present invention is not particularly limited, and examples include ball grid arrays (BGAs), MAP type BGAs and the like. It can also be applied to a dual in-line package (DIP), a plastic leaded chip carrier (PLCC), a quad flat package (QFP), a low-profile quad flat package (LQFP), a small outline package (SOP), a small outline J-leaded package (SOJ), a thin small outline package (TSOP), a thin quad flat package (TQFP), a tape carrier package (TCP), a chip size package (CSP), a quad flat non-leaded package (QFN), a small outline non-leaded package (SON), a lead frame BGA (LF-BGA) and the like.

The semiconductor device of the present invention obtained by encapsulating a semiconductor element from a cured product of the resin composition by compression molding is used as it is or is mounted on any electronic apparatus after completely curing the resin composition at a temperature of about 80° C. to 200° C. over a period of about 10 minutes to 10 hours.

Hereinafter, the semiconductor device including a lead frame or a circuit board, one or more semiconductor elements laminated or mounted in parallel on the lead frame or the circuit board, bonding wires for electrically connecting the lead frame or the circuit board and the semiconductor elements, and an encapsulation material for encapsulating the semiconductor elements and the bonding wires will be described in detail with reference to the drawings. However, the present invention is not restricted to the semiconductor devices using bonding wires.

Figure 7:
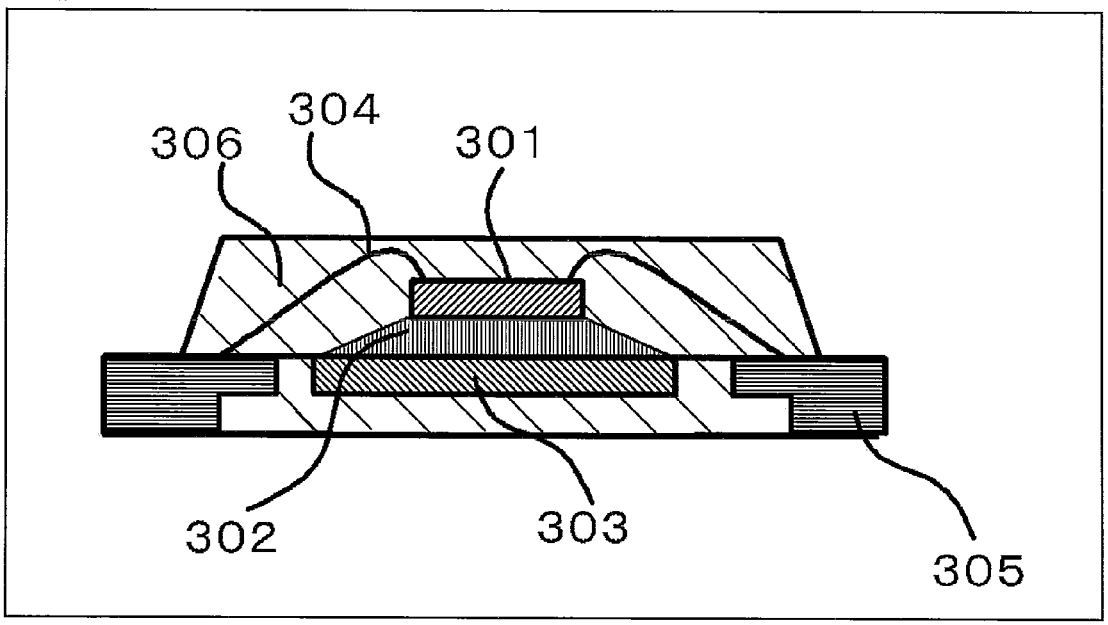
FIG. 7 is a view showing a cross-sectional structure of one example of a semiconductor device obtained by encapsulating a semiconductor element mounted on a lead frame using an epoxy resin composition for encapsulating a semiconductor according to the present invention.

FIG. 7 is a view showing a cross-sectional structure of one example of a semiconductor device obtained by encapsulating a semiconductor element mounted on a die pad of a lead frame using the epoxy resin composition for encapsulating a semiconductor according to the present invention. A semiconductor element 301 is fixed through a die bond material cured product 302 on a die pad 303. An electrode pad of the semiconductor element 301 and a lead frame 305 are connected by means of a wire 304. The semiconductor element 301 is encapsulated with an encapsulation material 306 composed of a cured product of the resin composition for encapsulating a semiconductor.

Figure 8:
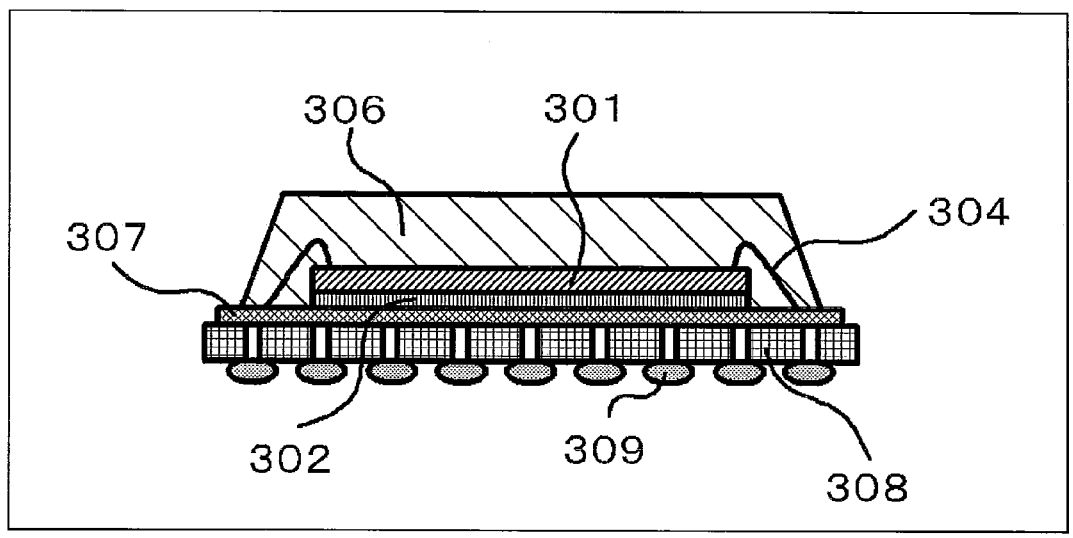
FIG. 8 is a view showing a cross-sectional structure of one example of a semiconductor device obtained by encapsulating a semiconductor element mounted on a circuit board using an epoxy resin composition for encapsulating a semiconductor according to the present invention.

FIG. 8 is a view showing a cross-sectional structure of one example of a semiconductor device obtained by encapsulating a semiconductor element mounted on a circuit board using the epoxy resin composition for encapsulating a semiconductor according to the present invention. A semiconductor element 301 is fixed through a die bond material cured product 302 on a circuit board 308. An electrode pad 307 of the semiconductor element 301 and an electrode pad 307 on the circuit board 308 are connected by means of a wire 304. Only one side on which the semiconductor element 301 in the circuit board 308 is mounted is encapsulated with an encapsulation material 306 composed of a cured product of the epoxy resin composition for encapsulating a semiconductor. The electrode pad 307 on the circuit board 308 is connected with solder balls 309 at a non-encapsulated side on the circuit board 308 thereinside.

EXAMPLES

The present invention is now illustrated in more detail below with reference to Examples. However, the present invention is not restricted to these Examples.

Example 1

Epoxy resin 1: 8.53 parts by mass of a phenol aralkyl type epoxy resin having a biphenylene structure (NC-3000, manufactured by Nippon Kayaku Co., Ltd., softening point: 52° C., epoxy equivalent: 270)

Phenolic resin 1: 6.42 parts by mass of a phenol aralkyl resin having a biphenylene structure (MEH-7851, manufactured by Meiwa Plastic Industries, Ltd., softening point: 67° C., hydroxyl equivalent: 203)

Curing accelerator 1 (TPPBQ, manufactured by Hokko Chemical Industry Co., Ltd.) 0.55 parts by mass Molten spherical silica (FB-560, manufactured by Denki Kagaku Kogyo Kabushiki Kaisha, average particle diameter: 30 μm) 84 parts by mass Coupling agent (KBM-803, manufactured by Shin-Etsu Chemical Co., Ltd.) 0.2 parts by mass Carnauba wax 0.3 parts by mass The above mixed raw materials of the resin composition for encapsulating a semiconductor were pulverized and mixed by use of a super mixer for 5 minutes, and then the mixed raw materials were melt-kneaded using a co-rotating twin screw extruder equipped with a cylinder having an inner diameter of 65 mm with the number of screw rotations of 30 RPM at a resin temperature of 100° C., whereby a melt-kneaded resin composition was prepared. Subsequently, the melt-kneaded resin composition was supplied at a rate of 2 kg/hr from the upper side of the rotor having a diameter of 20 cm, and allowed to pass through a plurality of small pores (pore diameter: 2.5 mm) of the heated cylindrical outer peripheral portion at 115° C. by centrifugal force obtained by the rotation of the rotor at 3,000 RPM, whereby a granular resin composition for encapsulating a semiconductor was obtained.

Examples 2 to 4 and Comparative Examples 1 to 6

According to mixture shown in Table 1, granular resin compositions for encapsulating a semiconductor in Examples 2 to 4 and Comparative Examples 1 to 6 were obtained in the same manner as in Example 1.

Examples 5 to 7

In the same manner as in Example 1, the raw materials were pulverized and mixed by use of a super mixer for 5 minutes, and then the mixed raw materials were melt-kneaded using a co-rotating twin screw extruder equipped with a cylinder having an inner diameter of 65 mm with the number of screw rotations of 30 RPM at a resin temperature of 100° C., and then made into a sheet form with a sheeting roller, followed by cooling and pulverizing. Thereafter, the particle size distributions were adjusted using sieves so as to have the amounts of microfine particles and the amounts of coarse particles shown in Table 2, whereby granular resin compositions for encapsulating a semiconductor of Examples 5 to 7 were obtained.

Comparative Example 7

In the same manner as in Example 2, the raw materials were pulverized and mixed by use of a super mixer for 5 minutes, and then the mixed raw materials were melt-kneaded using a co-rotating twin screw extruder equipped with a cylinder having an inner diameter of 65 mm with the number of screw rotations of 30 RPM at a resin temperature of 100° C., and then made into a sheet form with a sheeting roller, followed by cooling and pulverizing. Thereafter, the particle size distribution was adjusted using sieves so as to have the amount of microfine particles and the amount of coarse particles shown in Table 2, whereby a granular resin composition for encapsulating a semiconductor of Comparative Example 7 was obtained.

Following are the raw materials used, other than those used in Example 1.

Epoxy resin 2: A triphenylmethane type epoxy resin (1032H60, manufactured by Japan Epoxy Resin Co., Ltd., softening point: 59° C., epoxy equivalent: 171)

Epoxy resin 3: A biphenyl type epoxy resin (YX-4000, manufactured by Japan Epoxy Resin Co., Ltd., melting point: 107° C., epoxy equivalent: 190)

Epoxy resin 4: A dicyclopentadiene-modified epoxy resin (HP-7200, manufactured by DIC Corporation, softening point: 64° C., epoxy equivalent: 265)

Epoxy resin 5: A cresol novolac epoxy resin (N660, manufactured by DIC Corporation, softening point: 60° C., epoxy equivalent: 200)

Phenolic resin 2: A triphenylmethane type phenolic resin (MEH-7500, manufactured by Meiwa Plastic Industries, Ltd., softening point: 110° C., hydroxyl equivalent: 97)

Phenolic resin 3: A phenolic novolac resin (PR-51714, manufactured by Sumitomo Bakelite Co., Ltd., softening point: 110° C., hydroxyl equivalent: 104)

Phenolic resin 4: A phenol aralkyl resin having a phenylene structure (XL-225-3L, manufactured by Mitsui Chemicals, Inc., softening point: 80° C., hydroxyl equivalent: 175)

Crushed silica (FS-784, manufactured by Denki Kagaku Kogyo Kabushiki Kaisha, average particle diameter: 13 μm)

Curing accelerator 2: A curing accelerator represented by the following general formula (1),

[Chemical Formula 1]

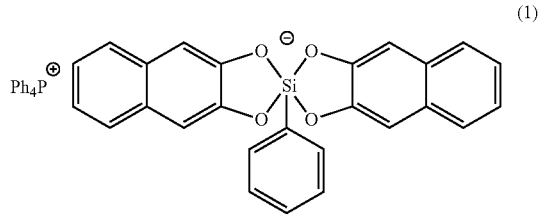

(1)

Curing accelerator 3: Triphenyl phosphine

Resin compositions for encapsulating a semiconductor were evaluated in the following method in Examples and Comparative Examples, and the evaluation results were shown in Tables 1 and 2.

Evaluation Method

Amount of microfine particles having a size of less than 106 μm and amount of coarse particles having a size of 2 mm or greater:

40 g of the obtained granular resin composition was weighed up to 1 mg to give a sample. The JIS standard sieves having apertures of 2.00 mm and 106 μm installed in a ro-tap type sieve shaker (Model-SS-100A, manufactured by Marubishi Kagaku Kikai Seisakusho Co. Ltd.) were used to classify the sample through the sieves while shaking these sieves over a period of 20 minutes (number of hammer strokes: 120/minute). Subsequently, the mass of microfine particles passing through the sieve of 106 μm and the mass of coarse particles remained on the sieve of 2 mm were measured to calculate the mass ratio of the amount of microfine particles having a size of less than 106 μm and the amount of coarse particles having a size of 2 mm or greater to the mass of the sample before classifying.

Spiral Flow:

The resin composition was injected into a spiral flow measuring mold built according to EMMI-1-66 under conditions of a mold temperature of 175° C., an injection pressure of 6.9 MPa and a hold time of 120 seconds, using a low-pressure transfer molding machine (KTS-15 manufactured by Kohtaki Precision Machine Co., Ltd.), and the flow length was measured. The spiral flow is a parameter of flowability, and a greater value indicates higher flowability. The unit is cm.

Time until the ion viscosity reaching the lowest ion viscosity, lowest ion viscosity and stable time:

A DEA231/1 cure analyzer manufactured by NETZSCH was used as a dielectric analyzer, and an MP235 Mini-Press manufactured by NETZSCH was used as a press. A changes in the viscosity was measured in accordance with ASTM E2039 by the following method. About 3 g of a granular resin composition for encapsulating a semiconductor was introduced onto the top surface of an electrode portion in the press at a measurement temperature of 175° C. and at a measurement frequency of 100 Hz, and pressed. The time from the initiation of the measurement until a decrease of the ion viscosity to the lowest ion viscosity (the time until the ion viscosity reaching the lowest ion viscosity), the lowest ion viscosity, and the time interval between the time from the initiation of the measurement until a decrease of the ion viscosity to the lowest ion viscosity and the time from the initiation of the measurement until the ion viscosity reaching 90% of an ion viscosity value measured at 300 seconds (stable time) were shown in Table. The time until a decrease of the ion viscosity to the lowest ion viscosity is a parameter related to ease of melting as the granular resin composition, and a smaller value means ease of melting. The unit is second. The lowest ion viscosity is a parameter related to flowability, and a smaller value means better flowability. The lowest ion viscosity has no units. The stable time is a parameter related to the time width of the granular resin composition having flowability, and a smaller value means shorter time width of the flowability. The unit is second.

Adhesion or Attachment on the Conveyance Path:

100 g of the resin composition sample was supplied to a hopper in a vibration feeder (450 mm long×55 mm wide), and then the vibration strength was adjusted so as to have the amount of conveyance of 18 g/minute, and 10 g thereof was conveyed. Then, conveyance was repeatedly stopped for 3 minutes and as such, the total amount of 100 g was conveyed. After conveyance, the status of adhesion among particles or attachment onto the vibration feeder was observed to confirm existence of adhesion or attachment.

Weighing Accuracy:

100 g of the resin composition sample was supplied to a hopper in a vibration feeder (450 mm long×55 mm wide), and then the vibration strength was adjusted so as to have the amount of conveyance of 18 g/minute. After conveyance for 1 minute, conveyance was repeatedly stopped for 3 minutes, and an average value and a standard deviation of respective amounts of conveyance were determined.

Wire Sweep Rate:

A chip having a chip size of 7×7×0.4 mm was mounted on a resin substrate (size: 150×55 mm), the chip mounted on the substrate electrically connected by gold wires of φ18 μm was placed in an upper cavity of a compression mold, the resin composition weighed by use of a vibration feeder was put into a lower cavity of the compression mold. Thereafter, a MAP-BGA semiconductor device was molded under conditions of a mold temperature of 175° C., a curing time of 120 seconds and a molding pressure of 9.8 MPa using a compression molding machine, and a panel was further cut, whereby a semiconductor device was obtained. The size of the semiconductor device after cutting was 22×22 mm, the thickness of the resin portion was 550 μm, and the thickness of the resin portion on the chip was 150 μm. The prepared package was observed with a soft X-ray fluoroscope (PRO-TEST-100, manufactured by Softex Corp.), whereby an average sweep rate of 4 longest gold wires (length: 5 mm) on the diagonal line of the package was represented by a ratio of (sweep amount)/(gold wire length). The unit was %.

Void:

The semiconductor device after cutting for evaluation of the above wire sweep rate was taken as a sample. Internal voids were evaluated using a soft X-ray and the number of voids having a size of 0.5 mm or greater was counted. When an average of the number of the semiconductor devices n=6 was obtained, an average of 3.0 or less was determined as excellent (A), and an average exceeding 3.0 was determined as defective (B).

TABLE 1

|  | Example 1 | Example 2 | Example 3 | Example 4 | Comparative Example 1 |
|---|---|---|---|---|---|
| Epoxy resin 1 | 8.53 |  |  | 8.53 |  |
| Epoxy resin 2 |  | 10.91 |  |  |  |
| Epoxy resin 3 |  |  | 5.28 |  |  |
| Epoxy resin 4 |  |  |  |  | 15.10 |
| Epoxy resin 5 |  |  |  |  |  |
| Phenolic resin 1 | 6.42 |  | 5.80 | 6.42 |  |
| Phenolic resin 2 |  | 6.19 |  |  |  |
| Phenolic resin 3 |  |  |  |  | 5.92 |
| Phenolic resin 4 |  |  |  |  |  |
| Curing accelerator 1 | 0.55 | 0.40 | 0.42 |  | 0.48 |
| Curing accelerator 2 |  |  |  | 0.55 |  |
| Curing accelerator 3 |  |  |  |  |  |
| Molten spherical silica | 84 | 82 | 88 | 84 | 78 |
| Crushed silica |  |  |  |  |  |
| Coupling agent | 0.2 | 0.2 | 0.2 | 0.2 | 0.2 |
| Carnauba wax | 0.3 | 0.3 | 0.3 | 0.3 | 0.3 |
| Amount of microfine particles having a size of less than 106 μm [% by mass] | 1.1 | 2.1 | 1.7 | 1.5 | 3.3 |
| Amount of coarse particles having a size of 2 mm or greater [% by mass] | 1.3 | 1.9 | 2.6 | 1.1 | 1.1 |
| Spiral flow [cm] | 157 | 122 | 206 | 166 | 127 |
| Time until a decrease of the ion viscosity to the lowest ion viscosity [sec] | 11 | 18 | 12 | 11 | 23 |
| Lowest ion viscosity | 6.19 | 6.43 | 5.83 | 6.16 | 6.55 |
| Stable time [sec] | 15 | 13 | 34 | 15 | 12 |
| Adhesion or attachment onto the conveyance path | No | No | No | No | No |
| Weighing accuracy Average value (g) | 10.1 | 9.9 | 10.2 | 10.1 | 10.1 |
| Weighing accuracy Standard deviation | 0.1 | 0.1 | 0.1 | 0.1 | 0.2 |
| Wire sweep rate [%] | 1.2 | 1.4 | 0.8 | 1.3 | 4.2 |
| Void | A | A | A | A | A |

|  | Comparative Example 2 | Comparative Example 3 | Comparative Example 4 | Comparative Example 5 | Comparative Example 6 |
|---|---|---|---|---|---|
| Epoxy resin 1 |  |  |  |  |  |
| Epoxy resin 2 |  |  |  |  |  |
| Epoxy resin 3 | 12.44 |  | 10.89 | 10.82 |  |
| Epoxy resin 4 |  | 12.39 |  |  |  |
| Epoxy resin 5 |  |  |  |  | 19.30 |
| Phenolic resin 1 |  |  |  |  |  |
| Phenolic resin 2 |  |  |  |  |  |
| Phenolic resin 3 | 7.00 | 4.86 |  |  | 10.03 |
| Phenolic resin 4 |  |  | 10.31 | 10.23 |  |
| Curing accelerator 1 | 0.56 |  |  |  |  |
| Curing accelerator 2 |  |  |  |  |  |
| Curing accelerator 3 |  | 0.25 | 0.30 | 0.45 | 0.17 |
| Molten spherical silica | 29.5 | 82 |  | 78 |  |
| Crushed silica | 50 |  | 78 |  | 70 |
| Coupling agent | 0.2 | 0.2 | 0.2 | 0.2 | 0.2 |
| Carnauba wax | 0.3 | 0.3 | 0.3 | 0.3 | 0.3 |
| Amount of microfine particles having a size of less than 106 μm [% by mass] | 1.7 | 1.6 | 2.2 | 1.9 | 2.5 |
| Amount of coarse particles having a size of 2 mm or greater [% by mass] | 1.8 | 2.7 | 1.8 | 1.4 | 2.2 |

TABLE 1-continued

| | | | | | |
|---|---|---|---|---|---|
| Spiral flow [cm] | 133 | 115 | 88 | 121 | 92 |
| Time until a decrease of the ion viscosity to the lowest ion viscosity [sec] | 22 | 25 | 17 | 16 | 20 |
| Lowest ion viscosity | 6.30 | 6.67 | 6.43 | 6.40 | 6.75 |
| Stable time [sec] | 21 | 13 | 6 | 4 | 17 |
| Adhesion or attachment onto the conveyance path | No | No | No | No | No |
| Weighing accuracy Average value (g) | 10.0 | 9.8 | 9.8 | 9.9 | 9.9 |
| Standard deviation | 0.1 | 0.3 | 0.2 | 0.2 | 0.3 |
| Wire sweep rate [%] | 3.5 | 4.4 | 2.7 | 2.2 | 5.3 |
| Void | A | A | B | B | A |

TABLE 2

| | Example 1 | Example 5 | Example 6 | Example 7 | Example 2 | Comparative Example 7 |
|---|---|---|---|---|---|---|
| Epoxy resin 1 | 8.53 | 8.53 | 8.53 | 8.53 | | |
| Epoxy resin 2 | | | | | 10.91 | 10.91 |
| Epoxy resin 3 | | | | | | |
| Epoxy resin 4 | | | | | | |
| Epoxy resin 5 | | | | | | |
| Phenolic resin 1 | 6.42 | 6.42 | 6.42 | 6.42 | | |
| Phenolic resin 2 | | | | | 6.19 | 6.19 |
| Phenolic resin 3 | | | | | | |
| Phenolic resin 4 | | | | | | |
| Curing accelerator 1 | 0.55 | 0.55 | 0.55 | 0.55 | 0.40 | 0.40 |
| Curing accelerator 2 | | | | | | |
| Curing accelerator 3 | | | | | | |
| Molten spherical silica | 84 | 84 | 84 | 84 | 82 | 82 |
| Crushed silica | | | | | | |
| Coupling agent | 0.2 | 0.2 | 0.2 | 0.2 | 0.2 | 0.2 |
| Carnauba wax | 0.3 | 0.3 | 0.3 | 0.3 | 0.3 | 0.3 |
| Amount of microfine particles having a size of less than 106 μm [% by mass] | 1.1 | 4.1 | 11.2 | 2.2 | 2.1 | 2.2 |
| Amount of coarse particles having a size of 2 mm or greater [% by mass] | 1.3 | 2.6 | 2.6 | 3.9 | 1.9 | 5.5 |
| Spiral flow [cm] | 157 | 166 | 161 | 167 | 122 | 123 |
| Time until a decrease of the ion viscosity to the lowest ion viscosity [sec] | 11 | 11 | 9 | 17 | 18 | 22 |
| Lowest ion viscosity | 6.19 | 6.20 | 6.30 | 6.22 | 6.43 | 6.40 |
| Stable time [sec] | 15 | 15 | 12 | 17 | 13 | 14 |
| Wire sweep rate [%] | 1.2 | 1.5 | 1.8 | 1.7 | 1.4 | 3.3 |
| Void | A | A | A | A | A | A |

First, Examples 1 to 4 and Comparative Examples 1 to 6 carried out in the same production method were compared. The kind and mixing amount of the epoxy resin, the curing agent and the curing accelerator were different, whereas in all Examples 1 to 4 in which the time until a decrease of the ion viscosity to the lowest ion viscosity was 20 seconds or shorter, the lowest ion viscosity was not more than 6.5 and the stable time was 10 seconds or longer, the wire sweep rate was small and existence of voids was not observed. As a result, in Examples 1 to 4, the amount of microfine particles having a size of less than 106 μm was not more than 5% by mass, the amount of coarse particles having a size of 2 mm or greater was not more than 3% by mass, so that adhesion or attachment onto the conveyance path did not occur and weighing accuracy was also excellent. On the other hand, in Comparative Examples 1 to 3 and 6 in which the time until a decrease of the ion viscosity to the lowest ion viscosity exceeded 20 seconds and/or the lowest ion viscosity exceeded 6.5, the wire sweep was inferior. Also, in Comparative Examples 4 and 5 in which the stable time was 10 seconds or shorter, existence of voids was observed.

Next, Examples 5 to 7 carried out in the same manner as in Example 1 and Comparative Example 7 carried out in the same manner as in Example 2 were compared. The particle size distributions were a little different, whereas in all Examples 5 to 7 in which the time until a decrease of the ion viscosity to the lowest ion viscosity was 20 seconds or shorter, the lowest ion viscosity was not more than 6.5 and the stable time was 10 seconds or longer, the wire sweep rate was small and existence of voids was not observed. On the other hand, in Comparative Example 7 in which the amount of coarse particles having a size of 2 mm or greater was high and the time until a decrease of the ion viscosity to the lowest ion viscosity exceeded 20 seconds, the wire sweep was inferior. Furthermore, with respect to the epoxy resin molding material disclosed in Patent Document 1, similarly to Comparative Example 7, coarse particles having a size of 2 mm or greater were contained in a significant amount. Thus, it was considered that, even when the epoxy resin molding material disclosed in Patent Document 1 was used, the wire sweep was inferior, similarly to Comparative Example 7.

The granular resin composition for encapsulating a semiconductor of the present invention can be suitably used for a semiconductor device subjected to narrow gap formation right above a chip due to fine pitch wire bonding, finer wiring of wires, thinning of packages and elements made into multiple stages, and/or molding MAP formation.

The present application claims priority to Japanese Patent Application No. 2008-314066 filed on Dec. 10, 2008. The contents of the applications are incorporated herein by reference in their entirety.

The invention claimed is:

1. A granular resin composition for encapsulating a semiconductor element used for a semiconductor device obtained by encapsulating said semiconductor element by compression molding, satisfying the following requirements (a) to (c) on condition that ion viscosity is measured with a dielectric analyzer under a measurement temperature of 175° C. and a measurement frequency of 100 Hz:

(a) the time from the initiation of the measurement until a decrease of the ion viscosity to the lowest ion viscosity is 20 seconds or shorter;

(b) the lowest ion viscosity value is not more than 6.5; and (c) the time interval between the time from the initiation of the measurement until a decrease of the ion viscosity to the lowest ion viscosity and the time from the initiation of the measurement until the ion viscosity reaching 90% of an ion viscosity value measured at 300 seconds is 10 seconds or longer, wherein, in a particle size of said resin composition distribution as determined by sieving said resin composition for encapsulating and semiconductor element using JIS standard sieves microfine particles having a particle diameter of less than 106 μm is contained at a ratio of not more than 5% by mass, based on said resin composition for encapsulating said semiconductor element, wherein, in a particle size of said resin composition distribution as determined by sieving said resin composition for encapsulating said semiconductor clement using JIS standard sieves, coarse particles having a particle diameter of not less than 2 mm is contained at a ratio of not more than 3% by mass, based on said resin composition for encapsulating said semiconductor element.

2. The resin composition for encapsulating said semiconductor element according to claim 1, wherein said resin composition for encapsulating said semiconductor element is obtained by supplying said resin composition for encapsulating said semiconductor element which is melt-kneaded to the inside of a rotor composed of a cylindrical outer peripheral portion having a plurality of small pores and a disk-shaped bottom surface in which a temperature is adjusted by use of a direct or indirect heating means in a molten state, and allowing the resin composition for encapsulating semiconductor element to pass through said small pores by centrifugal force obtained by the rotation of said rotor.

3. A method for producing a semiconductor device, in which a semiconductor element is encapsulated by compression molding using the granular resin composition for encapsulating said semiconductor element according to claim 1.

4. The method for producing said semiconductor device according to claim 3, comprising carrying out a step of conveying and weighing said granular resin composition for encapsulating said semiconductor element immediately before the step of compression molding,

5. The method for producing said semiconductor device according to claim 3, comprising carrying out said compression molding while degassing air in the cavity of a compression mold.

6. A semiconductor device obtained by bonding and fixing a semiconductor element on a die pad of a lead frame or a substrate, connecting a wire bonding pad of said semiconductor element with an inner lead of said lead frame or a wire bonding pad on said substrate by means of wires, and then encapsulating said semiconductor element by compression molding using the resin composition for encapsulating said semiconductor element according to claim 1, wherein a diameter of said wire is not more than 18μm and a sweep rate of said wire is not more than 2.5%.

7. The semiconductor device according to claim 6, wherein a thickness of a cured product of said resin composition for encapsulating said semiconductor element on said semiconductor element is not more than 150 μm.

8. The resin composition for encapsulating said semiconductor element according to claim 1, wherein the resin composition comprises an epoxy resin and a curing agent.

9. The resin composition for encapsulating said semiconductor element according to claim 1, wherein the resin composition comprises an epoxy resin, a curing agent, a curing accelerator, and inorganic filler.

10. The resin composition for encapsulating said semiconductor element according to claim 1, wherein the resin composition comprises 2-15% by mass of an epoxy resin, 0.8-10% by mass of a curing agent, 0.1-1% by mass of a curing accelerator, and 78-93% by mass of a inorganic filler.

11. The resin composition for encapsulating said semiconductor element according to claim 9, wherein the curing agent is a phenolic resin, and the inorganic filler is a silica.

* * * * *